United States Patent [19]

Nishimoto

[11] Patent Number: 4,780,751

[45] Date of Patent: Oct. 25, 1988

[54] SEMICONDUCTOR INTEGRATED CIRCUIT DEVICE

[75] Inventor: Shozo Nishimoto, Tokyo, Japan

[73] Assignee: NEC Corporation, Tokyo, Japan

[21] Appl. No.: 829,897

[22] Filed: Feb. 18, 1986

[30] Foreign Application Priority Data

Feb. 15, 1985 [JP] Japan .................................. 60-27843

[51] Int. Cl.⁴ ............................................ H01L 29/78
[52] U.S. Cl. .................................. 357/23.6; 357/23.7;
357/41; 357/51; 357/59
[58] Field of Search .................... 357/23.7, 41, 51, 59,
357/23.6

[56] References Cited

U.S. PATENT DOCUMENTS

| | | | |
|---|---|---|---|
| 4,488,348 | 12/1984 | Jolly ..................................... | 357/23.7 |
| 4,541,006 | 9/1985 | Ariizumi et al. ..................... | 357/23.7 |
| 4,570,175 | 2/1986 | Miyao et al. ......................... | 357/41 |
| 4,656,731 | 4/1987 | Lam et al. ............................ | 357/23.7 |

OTHER PUBLICATIONS

R. Garnache, "Complementary FET Memory Cells," IBM Tech. Discl., Bull., vol., 18 #12, May 1976, pp. 3947–3948.

Primary Examiner—Joseph E. Clawson, Jr.
Attorney, Agent, or Firm—Sughrue, Mion, Zinn, Macpeak, and Seas

[57] ABSTRACT

A semiconductor integrated circuit device having a flip-flop circuit with first and second insulated gate field effect transistors is disclosed. The gate electrode of the first transistor is connected to one impurity region of source and drain regions of the second transistor, and the gate electrode of the second transistor is connected to one impurity region of source and drain regions of the first transistor. A part of the one impurity region of the first transistor and a part of the one impurity region of the second transistor are overlapped each other with an insulating film being interposed therebetween to form a capacitor element by using the impurity regions as upper and lower electrodes, respectively, and the insulating film as a dielectric film.

10 Claims, 3 Drawing Sheets

SEMICONDUCTOR INTEGRATED CIRCUIT DEVICE

BACKGROUND OF THE INVENTION

The present invention relates to a semiconductor integrated circuit device, and more particularly to a structure of a flip-flop constituting a memory cell in a memory device.

The memory cell of Static RAM type comprises a pair of driver transistors, a pair of transfer gate transistors coupled to the driver transistors and digit lines and a pair of load elements coupled to a power supply line and the driver transistors. The driver transistors constitute a flip-flop circuit. When these transistors are insulated gate type field effect transistors (hereinafter referred to IGFET), a drain region of a first driver IGFET is connected to a gate electrode of a second driver IGFET so as to obtain a first node while a drain region of the second driver IGFET is connected to a gate electrode of the first driver IGFET so as to obtain a second node. This circuit is used in a state wherein, depending on whether each of the first and second driver IGFET's is an n-channel type or a p-channel type, the common source region is connected to a low-potential side or a high-potential side and the two nodes are separately connected to a power source either on a high-potential side or on a low-potential side through load elements.

There has recently been a strong demand for the provision of a large-scale, highly-integrated type of semiconductor integrated circuit by developments in minute processing techniques. In these circumstances, however, if the flip-flop structure which relies upon the conventional structure is to be miniaturized, it involves the disadvantage of losing resistance to the alteration of stored information which is caused by natural radiation and the rays radiating from unstable radioisotopes contained in package material, a so-called soft error. Specifically, soft error is the phenomenon by which the above-mentioned radiation mainly composed of α particles causes ionization in the nodes of each flip-flop, the substrate and so forth, and excessive electrical charges are thus produced to temporarily change the potential of each node, thereby causing the state of the flip-flop to be inverted. This phenomenon frequently occurs when, as a result of miniaturization, an impurity diffused layer and so forth are made small and the electrical capacitance of each node is thus reduced since the above-mentioned electrical charges are recombined and each node potential thus easily fluctuates. In order to solve this disadvantage, it is preferable to prevent any decrease in the electrical capacitance of each node while satisfying the need for miniaturization. To this end, what might first be considered is to enhance the impurity concentration in the semiconductor substrate so as to increase the junction capacitance of the drain region of the driver transistor which forms each node. However, in this case, the transfer gate IGFET's are also formed in the same semiconductor substrate of high impurity concentration, and therefore, the electrical capacitance of source or drain region of the transfer gate IGFET and that of the digit line coupled to a plurality of the transfer gate IGFET's are enhanced. Consequently, the switching or operation speed for reading and writing is delayed. Another method which might be considered is to locate close together the diffused drain regions of the pair of the driver IGFET's constituting the nodes of the IGFET's which form flip-flops, so that their capacitance can be mutually increased. However, in a memory device having flip-flops which are arranged at a high density, a pattern providing interconnection, for example, an aluminum pattern, is normally formed over the structure with an insulating layer film interposed therebetween by a deposition process, reducing the threshold voltage of a parasitic transistor formed between the impurity diffused drain regions of the driver IGFET's as source and drain. Therefore, it is impossible to allow to come close enough to the drain regions to affect an increase in the electrical capacitance of each node.

SUMMARY OF THE INVENTION

Accordingly, it is an object of the present invention to provide a semiconductor integrated circuit device such as SRAM type memory device having an effective flip-flop structure which has nodes of a sufficiently large electrical capacitance and is free from soft errors while satisfying the two great demands of the miniaturization required for a high degree of integration and an improvement in the operating speed resulting from the miniaturization.

According to a feature of the present invention, there is provided a semiconductor integrated circuit device comprising a first IGFET having a source region, a drain region and a gate electrode, and a second IGFET having a source region, a drain region and a gate electrode, the gate electrode of the first IGFET being connected to one of the source and drain regions of the second IGFET, the gate electrode of the second IGFET being connected to one of the source and drain regions of the first IGFET, and a part of the one of the source and drain regions of the first IGFET and a part of the one of the source and drain regions of the second IGFET being overlapped with an insulating film being interposed therebetween to form a capacitor element.

The insulating film of the capacitor element, that is, the so-called MOS type capacitor may be a silicon oxide film, a silicon nitride film, a aluminum oxide film, etc. or a multi-layered film of two or more these films. In view of reliability of the device and the effect of the present invention, that is, an enhancement of the capacitance at the node, the thickness of the insulating film using as a dielectric film of the capacitor element ranges from 200 Å to 500 Å in case of silicon oxide and from 200 Å to 1000 Å in case of silicon nitride which has a higher dielectric constant ($\epsilon$) than that of silicon oxide. The above-mentioned flip-flop structure may be used in a static type RAM cell in a memory device.

DETAILED DESCRIPTION OF THE PREFERRED EMBODIMENT

Figure 1:
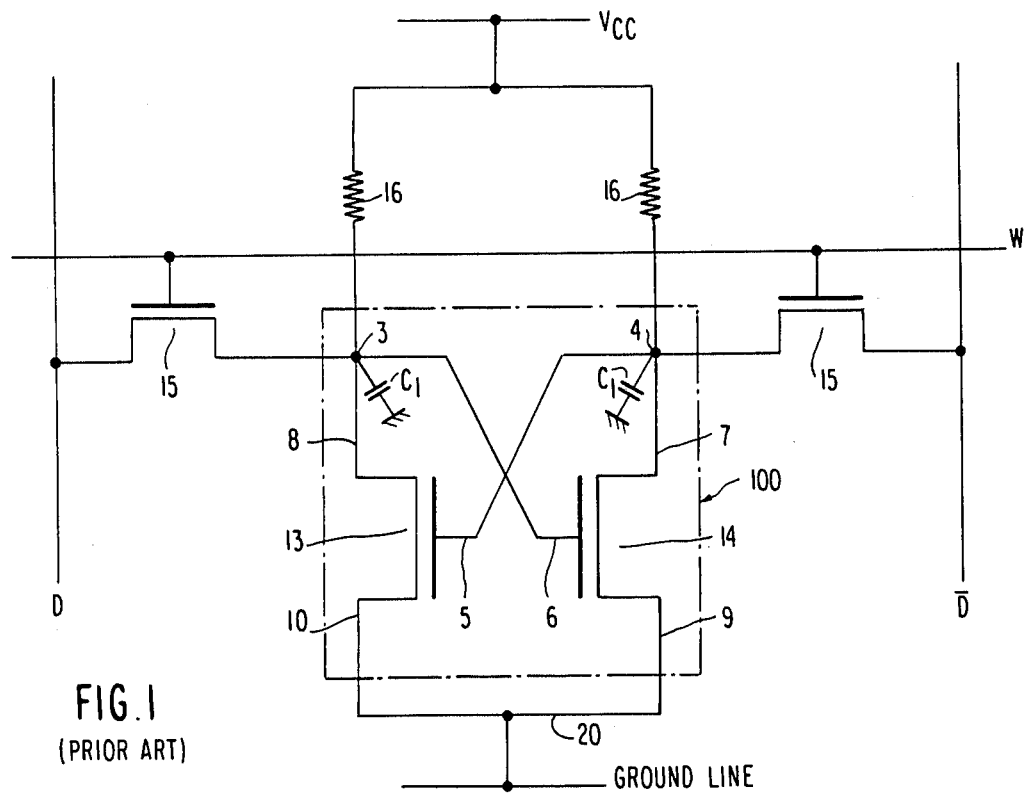
FIG. 1 is a circuit diagram of a conventional static RAM type memory cell.

Referring to FIG. 1, the basic arrangement of the memory cell is disclosed. A drain region 8 of a first driver IGFET 13 is connected to a gate electrode 6 of a second driver IGFET 14 so as to obtain a first node 3 while a drain region 7 of the second driver IGFET is connected to a gate electrode 5 of the first driver IGFET so as to obtain a second node 4. A source region 10 of the IGFET 13 is connected to a ground line with a source region 9 of of the IGFET 14 through a wiring layer 20. When the flip-flop circuit is used in the memory cell, the nodes 3, 4 are connected to a pair of digit lines D, $\overline{D}$ through transfer gate IGFET's 15, respectively, and connected to a power supply line Vcc through load elements 16 such as load IGFET's or load resistors, respectively. The gate electrodes of the transfer gate IGFET's 15 are commonly connected to a word line W. In the memory device, a plurality of memory cells are provided and connected to respective word lines, pairs of digit lines and power supply lines.

Figure 2A:
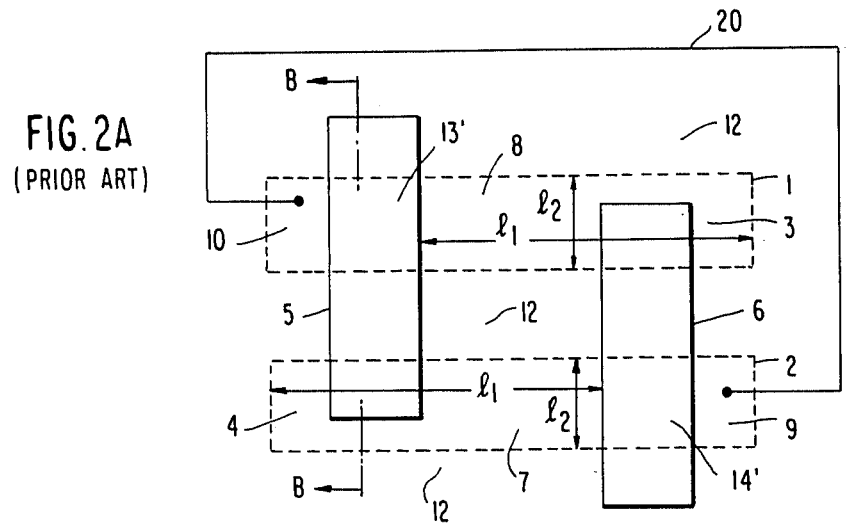
FIG. 2A is a plan view showing a conventional flip-flop structure used in FIG. 1.
Figure 2B:
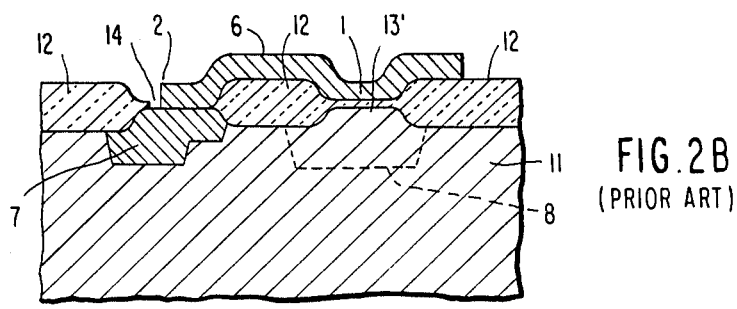
FIG. 2B is a cross-sectional view taken along B—B in FIG. 2A as viewed in the direction of arrows.

The structure of the flip-flop circuit encircled by a phantom line 100 in FIG. 1 is shown in FIGS. 2A and 2B. Elongated active regions 1, 2, that is, IGFET forming regions are provided in a major surface of a P-type silicon substrate 11 having an impurity concentration of $10^{15}$ to $10^{16}$ atoms/cm$^3$ and surrounded by a thick field oxide layer 12. N-type source and drain regions 7, 8, 9, 10 of the first and second driver IGFET's 13, 14 having an impurity concentration of $10^{20}$ atoms/cm$^3$ and depth of 0.3 $\mu$m are respectively formed in the first and second active regions 1, 2. The gate electrode 5 of N-type polycrystalline silicon is provided on a channel region 13' of the first IGFET 13 via a thin gate insulating film, extending on the thick field insulating layer 12 and directly connected to the drain region 7 of the second IGFET 14. Also, the gate electrode 6 of N-type polycrystalline silicon is provided on a channel region 14' of the second IGFET 14 via a thin gate insulating film, extending on the thick field insulating layer 12 and directly connected to the drain region 8 of the first IGFET 13. After forming the structure shown in FIG. 2B, a passivation film (not shown) is entirely deposited and the source regions 9, 10 of the IGFET's are commonly connected by a metallic layer 20 (FIG. 2A) through respective contact holes formed in the passivation layer. In such a prior art flip-flop structure, the nodes 3, 4 have only the PN junction capacitance formed between respective N-type drain regions 8, 7 and the P-type substrate. In this case, if the length l$_1$ and the width l$_2$ of each drain region are 5.5 $\mu$m and 1.5 $\mu$m, respectively, each PN junction capacitance C$_1$ (FIG. 1) of the node 3, 4 becomes about 7.5 fF (7.5×10 farad). To protect better against the soft errors mentioned above, the capacitance of the nodes must be higher.

Figure 3:
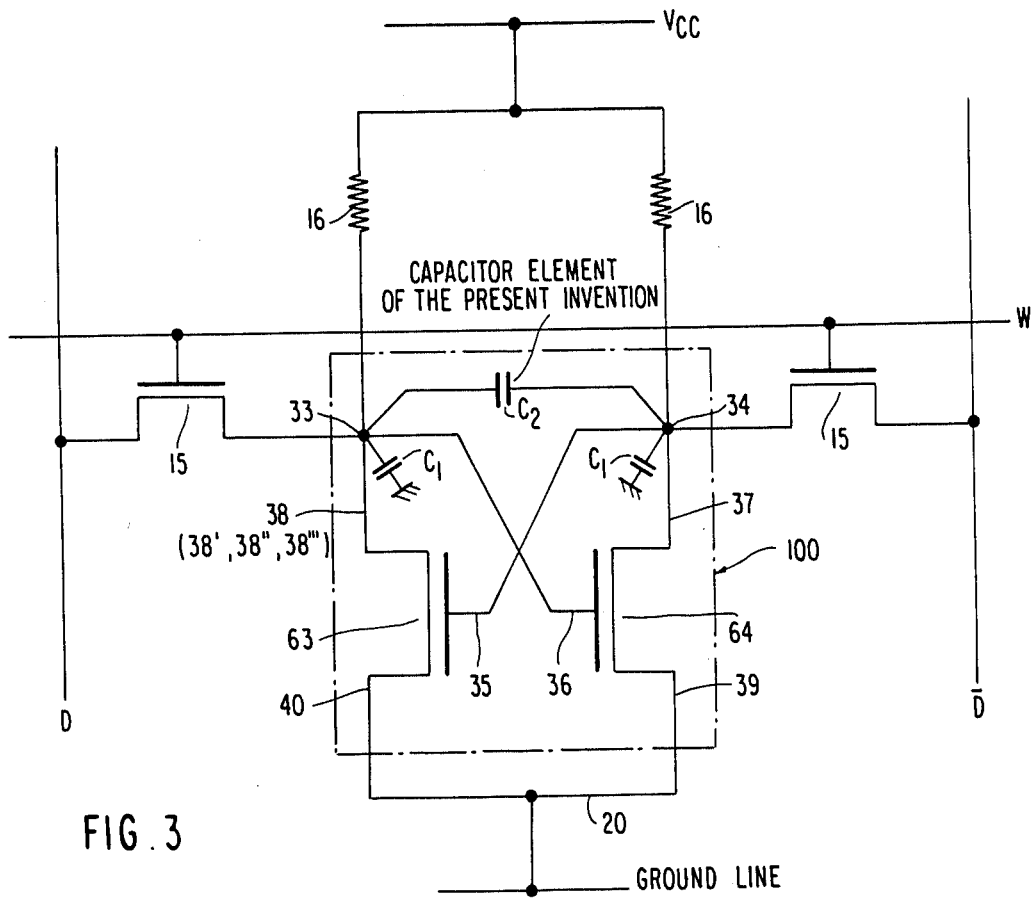
FIG. 3 is a circuit diagram of a static RAM type memory cell according to an embodiment of the present invention.

Referring to FIGS. 3 and 4, a new capacitor C$_2$ of the present invention is provided. In these FIGS. 3 and 4, components like those of FIGS. 1 and 2 have been identified with like numerals or symbols.

Figure 4A:
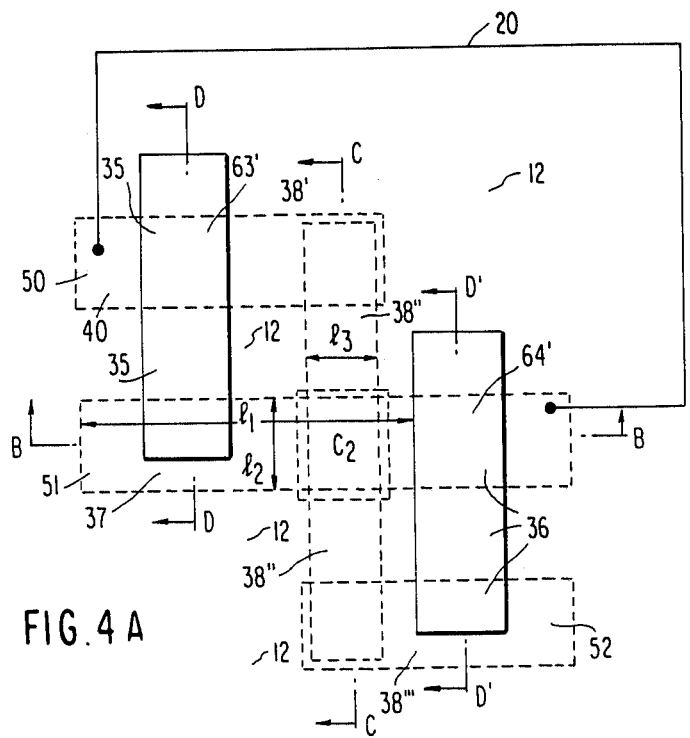
FIG. 4A is a plan view showing the flip-flop structure of an embodiment of the present invention used in FIG. 3, and FIG. 4B, FIG. 4C and FIG. 4D are cross-sectional views taken along B—B, C—C and D—D (D'—D') in FIG. 4A as viewed in the direction of arrows, respectively.
Figure 4B:
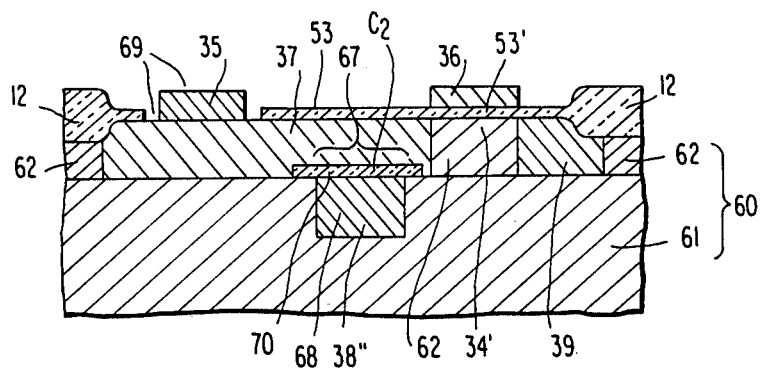
Figure 4C:
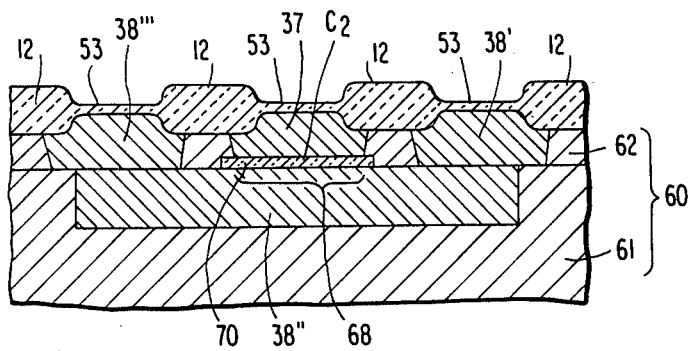
Figure 4D:
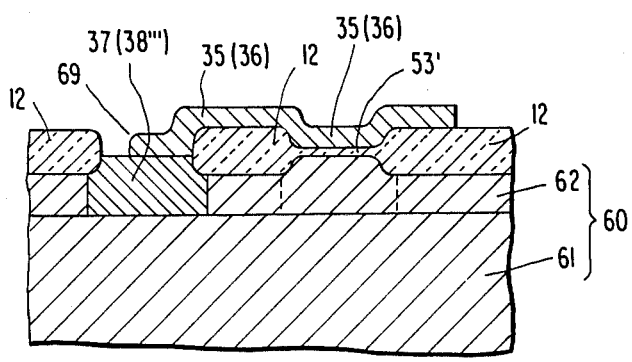

In the embodiment, an N-type impurity region 38'', that is, the buried diffused layer having an impurity concentration of $10^{20}$ atoms/cm$^3$ is formed in a P-type silicon monocrystalline body 61 having an impurity concentration of $10^{15}$ to $10^{16}$ atoms/cm$^3$, and a thin silicon oxide film 70 of 300 Å thickness is selectively formed on a portion 68 of the impurity region 38'' with a broader width than that of the portion 68 as shown in FIG. 4B by a thermal oxidation process followed by a photo lithography process. Next, a P-type silicon layer 62 having an impurity concentration of $10^{15}$ to $10^{16}$ atoms/cm$^3$ is grown on the silicon body 61 having the impurity region 38'' and the silicon oxide film 70. In this case, since the portion covered by the thin film 70 of silicon dioxide is sufficiently small, the single-crystallization of the entire layer 62 is enabled by using as a seed the surface of the single-crystal silicon body 61 whose majority portions are exposed. The silicon body 61 and the silicon layer 62 constitute a silicon substrate 60. The surface of the single-crystal silicon layer 62 is subjected to a selective oxidation process so as to obtain a thick field silicon oxide layer 12, and elongated active regions 50, 51, 52, that is, IGFET forming regions abutted against the field silicon oxide layer 12 and separated and provided in parallel with each other by the field silicon oxide layer 12. As shown in FIG. 4A, in the embodiment each active region and the buried impurity region 38'' have a uniform width to form a rectangular shape in the plan view. Subsequently, thermal oxidation is effected to the substrate surface whose actice regions are exposed, thereby forming thin silicon oxide films 53 including gate insulating films 53'. After holes 69 are so formed as to provide buried contacts, gate electrodes 35 and 36 are formed by the deposition of polycrystalline silicon containing an N-type impurity, that is, of conductivity type opposite to that of the substrate and by preforming a selective etching process. An of N-type impurity is introduced into the active regions 50, 51, 52 by using the gate electrodes 35, 36 and the thick field insulating layer 12 as a mask by ion implantation, and thermal treatment is effected so as to form N-type impurity regions 40, 38', 38''', 39, and 37 having an impurity concentration of $10^{20}$ atoms/cm$^3$. The parts of the silicon layer 62 directly contacted with the N-type silicon gate electrode in the holes 69 are converted to N-type when the N-type polycrystalline silicon layer is deposited and/or when the heat treatment is carried out after the ion implantation by diffusing N-type impurity through the polycrystalline silicon gate, and the other parts except the channel regions are converted to N-type by ion implanting an N-type ion such as arsenic through the thin insulating film 53 on which them to gate electrodes do not exist and by subjecting the heat treatment for activation of the implanted ions. According to the process steps mentioned above, the N-type impurity regions 38', 38''' are contacted at their bottoms to the N-type buried region 38'', and the N-type impurity region 37 is contacted at its bottom to the upper surface of the thin silicon oxide film 70. In the embodiment, the first driver IGFET 63 comprises an N-type drain region 38 including the N-type impurity regions 38', 38'', 38''', the N-type source region 40, the gate insulating film 53' on a channel region 63' in the active region 50, and the gate electrode 35. The second driver IGFET 64 comprises the N-type drain region 37, the N-type source region 39, the gate insulating film 53' on a channel region 64' in the active region 51, and the gate electrode 36. The gate electrode 35 of the first IGFET 63 extends on the field insulating layer 12 and is directly connected to the drain region 37 of the second IGFET 64, through the hole 69 in the film 53, and also, the gate electrode 36 extends on the field insulating layer 12 and is directly connected to the impurity region 38''' of the drain region 38 of the first driver IGFET 63 through the hole 69 in the film 53. In the embodiment, the impurity regions and/or the thick field insulating layer 12 may be formed into the body 61.

According to the embodiment, a portion 68 of the drain region 38" of the first driver IGFET 63, the thin silicon oxide film 70 and a portion 67 of the drain region 37 of the second driver IGFET 64 constitute a capacitor element, that is, a so-called MOS capacitor by using the region 37 as the upper electrode, the region 38" as the lower electrode and the thin film 70 as the dielectric film. When the length $l_1$ and the width $l_2$ of the drain region 37 of the second IGFET 64 are 5.5 $\mu$m and 1.5 $\mu$m, respectively, and the width $l_3$ of the drain region 38" of the first IGFET 63 is 1.5 $\mu$m, at the node 34, the PN capacitor $C_1$ becomes about 6.3 fF, and the MOS capacitor $C_2$ of about 2.6 fF can be added. Then, the total capacitance at the node 34 becomes 8.9 fF which is about 20% higher than that of the prior art structure shown in FIG. 2 when they are compared in the same conditions of the dimensions and the impurity concentrations. Further, the prior art structure depends only on the PN junction capacitor and the values mentioned above are for the state in which no positive potential is applied to the drain regions. In the state of the positive potential such as +5 volt being applied to the drain region, the PN junction capacitance becomes about one half of the value mentioned above. In this case, the existance of the MOS capacitor $C_2$ of the present invention is important. Moreover, if the material of the film 70 is changed from silicon oxide to silicon nitride, the capacity of the MOS capacitor $C_2$ is enhanced to about two times of the value of silicon oxide with the same thickness. Further, according to the present invention, to increase the capacitance of the node, only the portion 68 in the impurity region 38" and the portion 67 in the impurity region 37 which contribute to form the MOS capacitor $C_2$ can be enlarged without enlarging other portions in the impurity regions, that is, without sacrificing the integration of the device.

It is a matter of course that this invention does not depend on whether the IGFET's are of N-channel type or P-channel type and the gate electrode is not necessarily made of polycrystalline silicon. For example, the gate electrode may be a compound of tungsten, titanium, molybdenum and silicon and may also have a double layer of polycrystalline silicon and this compound.

What is claimed is:

1. A semiconductor integrated circuit device comprising:
    a monocrystalline silicon substrate of a first conductivity type;
    a first transistor having a source region, a drain region and a gate electrode; and
    a second transistor having a source region, a drain region and a gate electrode;
    said gate electrode of said first transistor being connected to one of said source and drain regions of said second transistor, said gate electrode of said second transistor being connected to one of said source and drain regions of said first transistor, each of said source and drain regions of said first and second transistors being of a second conductivity type, opposite said first conductivity type, and being provided in said substrate and forming a PN junction with said substrate, and a part of said one of said source and drain regions of said first transistor and a part of said one of said source and drain regions of said second transistor being overlapped with an insulating film being interposed therebetween to form a capacitor element within said substrate.

2. A semiconductor integrated circuit device of claim 1, in which said insulating film is made of silicon oxide.

3. A semiconductor integrated circuit device of claim 2, in which the thickness or said insulating film ranges from 200 Å to 500 Å.

4. A semiconductor integrated circuit device of claim 1, in which said insulating film is made of silicon nitride.

5. A semiconductor integrated circuit device of claim 4, in which the thickness of said insulating film ranges from 200 Å to 1000 Å.

6. A memory device comprising:
    a semiconductor substrate of a first conductivity type;
    a word line;
    a pair of digit lines; and
    a power supply line;
    said memory cell including first and second driver transistors each having source and drain regions and a gate electrode, first and second transfer gate transistors each having source and drain regions and a gate electrode, first and second loan element, and a capacitor element, said capacitor element being constructed within said substrate and being composed of an upper electrode of a second conductivity type opposite said first conductivity type and forming a first PN junction with said substrate, a lower electrode of said second conductivity type and forming a second PN junction with said substrate, and an insulating fill interposed between said upper and lower electrodes, said upper electrode being a part of one of said source and drain regions of said first driver transistor to which said gate electrode of said second driver transistor is connected, and said lower electrode being a part of one of said source and drain regions of said second driver transistor to which said gate electrode of said first driver transistor is connected.

7. A semiconductor integrated circuit device comprising:
    a monocrystalline silicon body of a first conductivity type;
    a monocrystalline silicon layer of said first conductivity type formed on said silicon body;
    an insulating film selectively provided between said silicon body and said silicon layer;
    a first impurity region of a second, opposite conductivity type formed in a major surface of said silicon layer so as to contact its bottom to an upper surface of said insulating film; and
    a second impurity region of said second conductivity type formed in said silicon body under said insulating film and contacted to a back surface of said insulating film, said second impurity region being out-diffused to said major surface of said silicon layer, wherein said first and second impurity regions constitute upper and lower electrodes of a capacitor and said insulating film constitutes a dielectric film thereof.

8. A semiconductor integrated circuit device of claim 7, in which said first impurity region is one of source and drain regions of a first insulated gate field effect transistor, and said second impurity region is one of source and drain regions of a second insulated gate field effect transistor.

9. A semiconductor integrated circuit device of claim 8, in which said first and second transistor are driver transistors in a flip-flop type memory cell.

10. A semiconductor integrated circuit device comprising:
- a semiconductor substrate of a first conductivity type and having a major surface;
- a field insulating film selectively formed on said major surface of said substrate;
- first, second and third impurity regions of a second conductivity type, opposite said first conductivity type, and formed in said major surface of said substrate, said first, second and third impurity regions being delineated by said field insulating film and extending in a first direction parallel to each other; and
- a fourth impurity region of said second conductivity type buried within said substrate and extending in a second direction at a right angle to said first direction, said fourth impurity region connectiing said first and third impurity regions and crossing under a part of said second impurity region by interposing a thin insulating film therebetween;
- whereby one of source and drain regions of a first insulated gate type field effect transistor is constituteed by said first, third and fourth impurity regions, and one of source and drain regions of a second insulated gate type field effect transistor is constituted by said second impurity region, a MOS type capacitor being constituted by said second and fourth impurity regions and said thin insulating film at their crossing part.

* * * * *

UNITED STATES PATENT AND TRADEMARK OFFICE
CERTIFICATE OF CORRECTION

PATENT NO. : 4,780,751

DATED : October 25, 1988

INVENTOR(S) : Shozo NISHIMOTO

It is certified that error appears in the above-identified patent and that said Letters Patent is hereby corrected as shown below:

COLUMN 3, LINE 54  Delete "(7.5 x 10 farad)" and insert -- (7.5 x $10^{-15}$ farad) --.

Signed and Sealed this

Ninth Day of May, 1989

*Attest:*

DONALD J. QUIGG

*Attesting Officer*   *Commissioner of Patents and Trademarks*